United States Patent [19]

Vaucher

[11] 4,074,514
[45] Feb. 21, 1978

[54] ISOCHRONOUS PERIOD GENERATOR HAVING MEANS FOR ADJUSTING THE ISOCHRONOUS PERIOD

[75] Inventor: Jean M. Vaucher, Brugg, Switzerland

[73] Assignee: Dynacore, S.A., Switzerland

[21] Appl. No.: 609,941

[22] Filed: Sept. 3, 1975

Related U.S. Application Data

[63] Continuation-in-part of Ser. No. 391,048, Aug. 24, 1973, abandoned.

[30] Foreign Application Priority Data

Aug. 24, 1972 Switzerland .................. 12570/72

[51] Int. Cl.² .............. G04C 3/00; H03K 21/32; H03K 1/17; H03B 3/04
[52] U.S. Cl. .................. 58/23 AC; 328/48; 328/63; 331/177 R
[58] Field of Search ............. 328/40, 63; 58/26 R, 58/35 W, 23 R, 85.5, 23 AC

[56] References Cited

U.S. PATENT DOCUMENTS

| | | | |
|---|---|---|---|
| 3,518,553 | 6/1970 | Ho et al. | 328/42 |
| 3,520,128 | 7/1970 | Noviko et al. | 58/24 R |
| 3,541,779 | 11/1970 | Langley | 58/50 R |
| 3,646,371 | 2/1972 | Flad | 307/221 C |
| 3,657,658 | 4/1972 | Kubo | 328/39 |
| 3,774,056 | 11/1973 | Sample | 328/48 |
| 3,811,265 | 3/1974 | Cater | 58/24 R |

FOREIGN PATENT DOCUMENTS 534,913   4/1973   Switzerland.

*Primary Examiner*—E. S. Jackmon
*Attorney, Agent, or Firm*—Stevens, Davis, Miller & Mosher

[57] ABSTRACT

An electronic watch including a reference isochronous period generator which can be reset or readjusted from outside the watch by a signal representing a standard time period. The generator includes a high frequency source having a period that does not exceed the maximum allowable deviation with respect to the isochronous period supplied by the generator, a dividing counter which receives the high frequency or a submultiple thereof, a detector which detects the signal and then enables the transition of the generator from an autonomous mode in which the isochronal period is provided to a readjustment mode in which the isochronal period is readjusted. Program logic circuitry for the dividing counter causes the counter to proceed to a counting cycle of a suitable number of bits when the counter is in the autonomous mode and to predetermine this proper number of bits on the basis of the standard time period when the counter is in the readjustment mode, the logic circuitry including a memory for storing the count obtained by the counter at the end of the standard time period, the counter being reset to zero at the beginning of this period.

21 Claims, 5 Drawing Figures

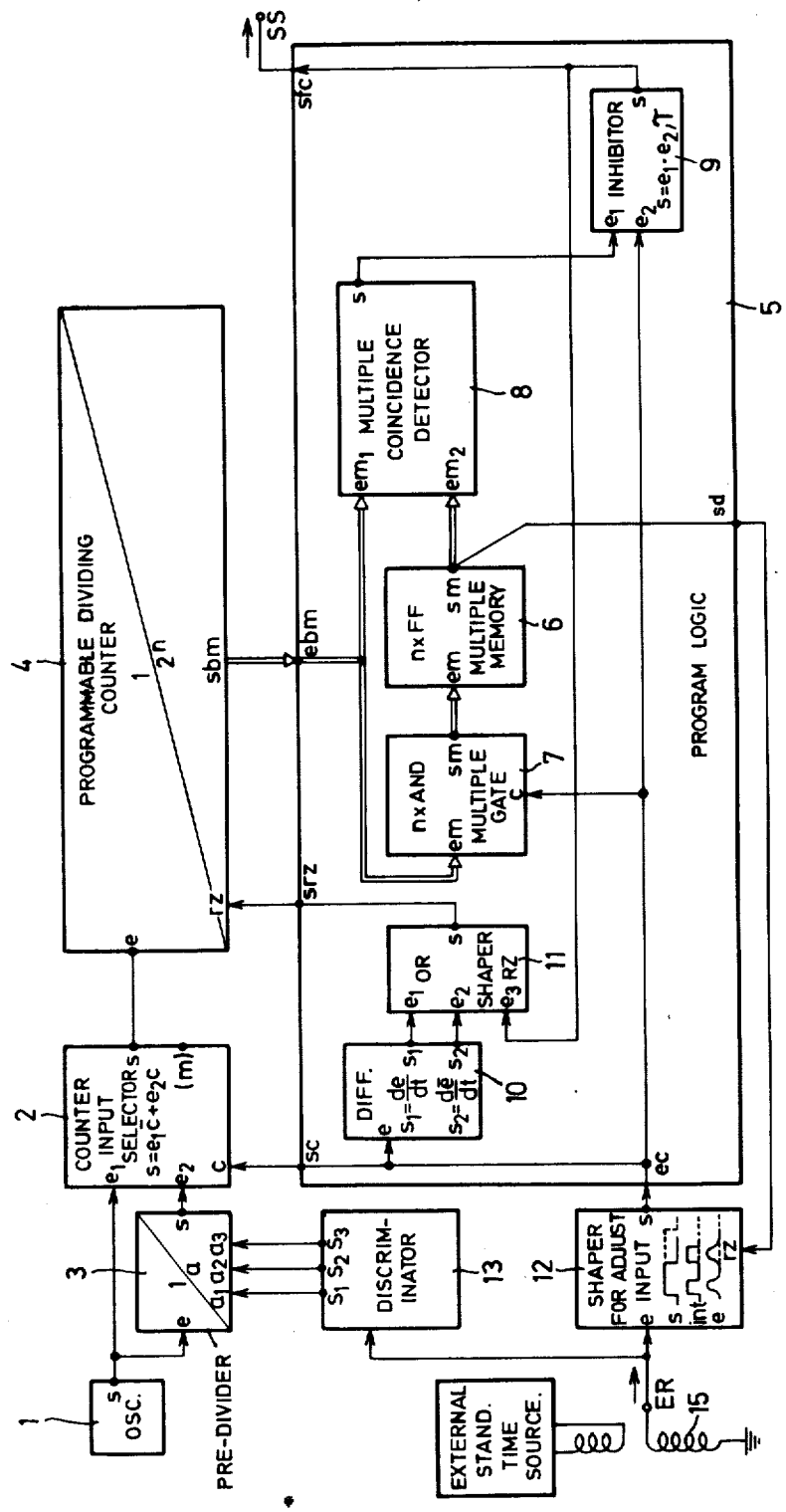

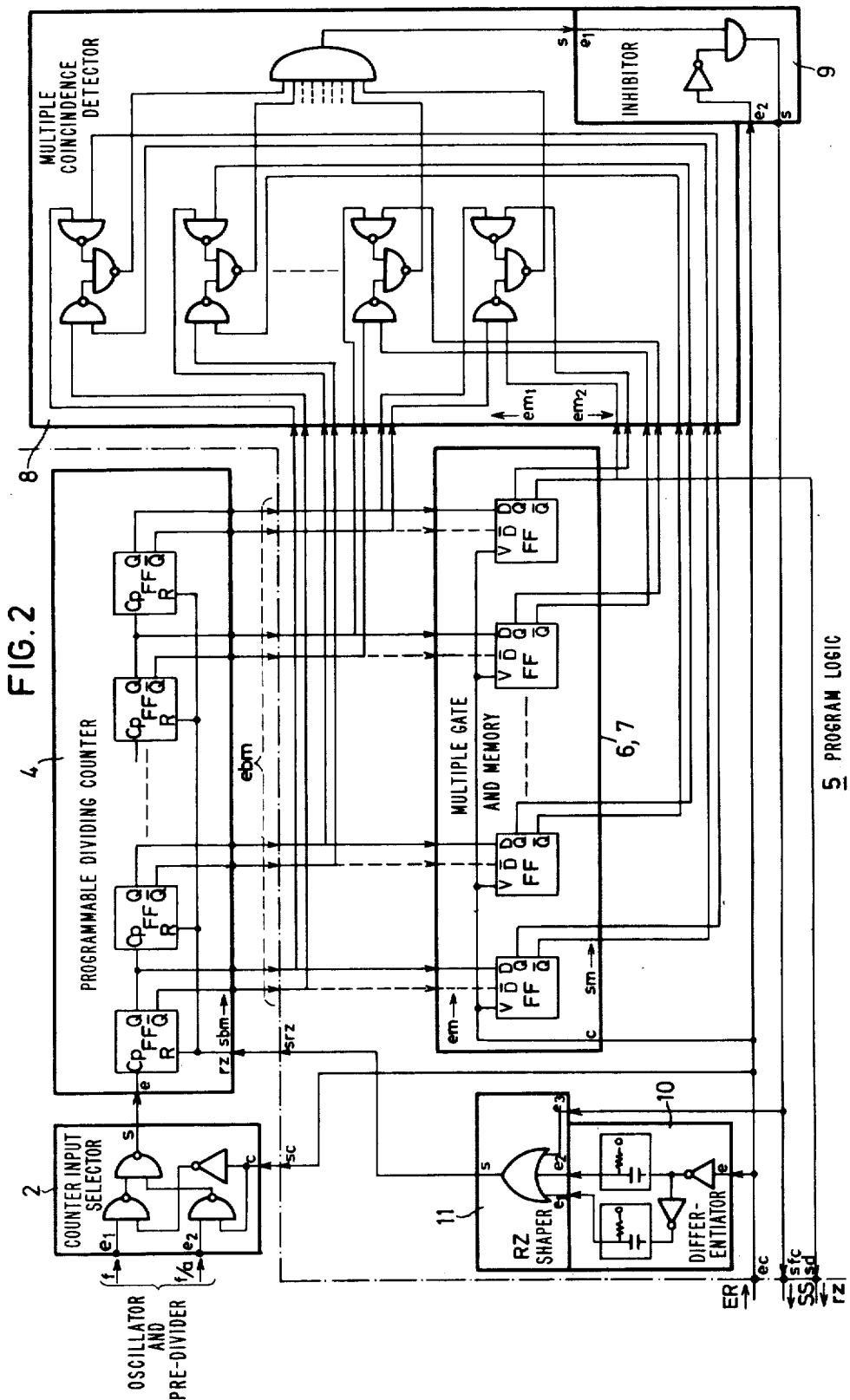

ISOCHRONOUS PERIOD GENERATOR HAVING MEANS FOR ADJUSTING THE ISOCHRONOUS PERIOD

CROSS-REFERENCES TO RELATED APPLICATIONS

This application is a continuation-in-part of application Ser. No. 391,048, filed Aug. 24, 1973 which is now abandoned.

BACKGROUND OF THE INVENTION

1. Field Of The Invention

The present invention relates to an electronic watch having an isochronous period generator for supplying an electrical output signal defining a succession of isochronous periods and, more particularly, to a period generator which is adjustable to a desired value of sufficient accuracy that at most a predetermined absolute adjustment error is tolerated.

2. Description Of The Prior Art

Presently, known electronic reference isochronous period generators intended to control time-measuring instruments comprise, typically, an oscillator generally operating at high frequency, that is, with short periods, this frequency being divided electronically in order to obtain a lower frequency the period of which corresponds to the isochronous interval sought, for instance, to activate time indicating means. The best known electronic time base generators of this kind make use of a quartz reference oscillator, the frequency of which is divided by a series of binary dividing stages. Be means of feed back connections or of pulse suppressing means the dividers may be caused to operate at any cycle different from $2^n$ ($n$=integer), but generally the high base frequency preferably is so adjusted as to be equal to the isochronous period being sought multiplied by $n^2$, where $n$ is the number of binary stages of the divider. Regardless of the method being used, the division ratio is generally fixed and the base high frequency must be exactly adjusted with respect to this division ratio.

A quartz oscillator provides extreme frequency accuracy, but in view of the very high quality factor Q of quartz, its frequency only can be adjusted with considerable difficulties by acting upon an element in the oscillator unless it be within an extremely narrow control range. Therefore, quartz must be cut with extreme accuracy in order to give it a natural resonance frequency extremely close to the required frequency for the desired reference isochronous period, and with the division ratio of the divider taken into account. This very high precision makes quartz costly. Furthermore, attention must be paid that the inherent aging of any oscillator shall not shift the quartz frequency outside the very narrow range within which adjustment is feasible, so that steps must be taken to provide that the quartz be only very slightly subjected to aging effects. Otherwise, subsequent compensation of aging variation becomes impossible. Again this adds to the costs involved in the use of quartz or other similar electrical oscillators that might also be used.

In U.S. Pat. No. 3,646,371 to Flad there is disclosed an electronic timing circuit which is resettable to adjust for deviations of the oscillator frequency from its nominal value. This patent is not concerned with a timing circuit for a watch, but rather a timing circuit for a rocket, the use of which is entirely different and which is subject to contingencies which are entirely different from those of a watch. Furthermore, in this known timing circuit of Flad there is no true isochronal period within the sense of the present invention since the period which one can set and reset in advance in Flad is in fact measured only once in autonomous operation whereupon the rocket explodes with the timing device.

The disclosure of Swiss Pat. No. 534,913, the specification (provisional patent) of which was published on May 15, 1972, also may be compared with the present invention. This Swiss patent discloses a quartz timer in which there is a frequency divider with an adjustable division ratio, this ratio being memorized in coded form in a memory. This Swiss patent is concerned only with a timer and not with a watch, and mentions miniaturization of the timer.

It may be thought that a combination of the disclosure of the Swiss Pat. No. 534,913 and the disclosure of the U.S. Pat. No. 3,646,371 might place an electronic watch in accordance with the present invention within the scope of one of ordinary skill in the art. However, this combination itself would raise a number of problems and it is entirely clear that those elements of the present invention which could be derived from the above-mentioned two patents could not be produced, or in any event could not be produced advantageously, without first of all having solved certain problems for which these patents provide no solution. Of primary concern is the fact that the setting or readjusting arrangement of the device in accordance with U.S. Pat. No. 3,646,371, first, uses galvanic connections (for instance "ground" 18 and "setter power" 24) and, secondly, requires that various other items of information also be transmitted by the galvanic connections (for instance "memory set" 20 and "memory reset" 22). Such a system with galvanic connections would probably make it possible to apply without great difficulty the resetting method disclosed by the U.S. Flad patent to a horological device of large dimensions and/or of a type such that the presence of connecting terminals is not disturbing. On the other hand, this arrangement would not make it possible — or then in all cases only in a very complicated and inconvenient manner and at the cost of a very large number of difficulties in construction — to apply this method to watches, for instance wristwatches, in view of, in particular, the very compact and closed structure of a watch and the practical impossibility of providing in it means for galvanic connection with the outside.

If the use of conventional wireless transmission means for a daily rate readjusting arrangement for a watch were contemplated, the transmissions would have to be at least of the multiple channel type, over several parallel channels, or by modulation and coding. This would enormously complicate the construction of the emitting and receiving transmission devices, in view of the very small dimensions of a watch and also the tolerance of the mutual positioning of the receiving members arranged within the watch and the emitting members located outside the watch, which tolerance would have to be very wide in order to make inconvenient manipulations unnecessary.

SUMMARY OF THE INVENTION

A purpose of the present invention consists of supplying an isochronous period generator free from the above-mentioned drawbacks, that is, one which will allow achieving accurately the desired isochronous period by using a high frequency source of any frequency within a very wide range of possible values, and which will also permit, in case the high frequency source undergoes an appreciable change in frequency caused, for instance, by the aging of this frequency source, a ready re-establishment of the proper value of the isochronous period with respect to the now modified high frequency.

Another object of the present invention is to provide an electronic watch with which automatic rapid readjustment is possible in an easy fashion, without requiring great structural complications in the watch, despite the special contingencies and the very small size which are present in the case of watches and in particular in the case of wristwatches.

In order to achieve these purposes, the electronic watch of the present invention includes a single detector means for receiving, from the outside of the watch, through the detection of a physical action not requiring any physical contact with the watch, a simple signal which conditions the watch for readjusting the isochronal period and defines a standard time period corresponding to the desired isochronal period. The detector means maintains precisely the reset condition or readjustment mode of the watch for the duration of the standard time period. During the entire time the standard time period signal is not being detected and the watch is not in the readjustment mode, an independent, i.e., autonomous mode or operating condition is established for the watch to produce the isochronal period.

BRIEF DESCRIPTION OF THE DRAWINGS

FIG. 1A is a general block diagram of one embodiment of a circuit generating isochronal periods for a watch, adapted to be readjusted and equipped with a unidirectional divider counter.

FIG. 2 is a more detailed diagram of a portion of the circuit in accordance with the embodiment of FIG. 1A.

As seen in FIG. 1A, the isochronal period generator, which is used as part of an electronic wristwatch, is arranged to work in two modes including (1) an autonomous mode in which the generator operates without any control from outside the wristwatch to generate an isochronous period at output terminal SS, and (2) a readjustment mode in which with a control from outside the wristwatch the isochronous period may be readjusted, at any time, the control being a standard time period applied to input ER. In order to realize these two modes of operation, the generator comprises an oscillator 1, on the basis of which the isochronous period at output terminal SS is produced and a counter input selector or selection circuit 2 which is, on the one hand, connected directly to the oscillator 1 and, on the other hand, by the intermediary of a predivider 3 to oscillator 1. The generator also comprises a programmable divider counter 4, connected to input selector 2, a programmable logic 5 for counter 4, and a signal shaper 12 for adequately forming information of a standard time period applied to input ER from a sensing coil 15. The programmable logic 5 includes a multiple memory 6, a multiple gate 7 controlling the inputs of memory 6, a multiple coincidence detector 8 which receives the outputs of counter 4 and memory 6, an inhibitor 9 connected to the output of detector 8, a differentiator 10 for receiving readjustment information provided by the shaper 12, and another signal shaper 11, connected to differentiator 10, for resetting to zero dividing counter 4.

Figure 1B:
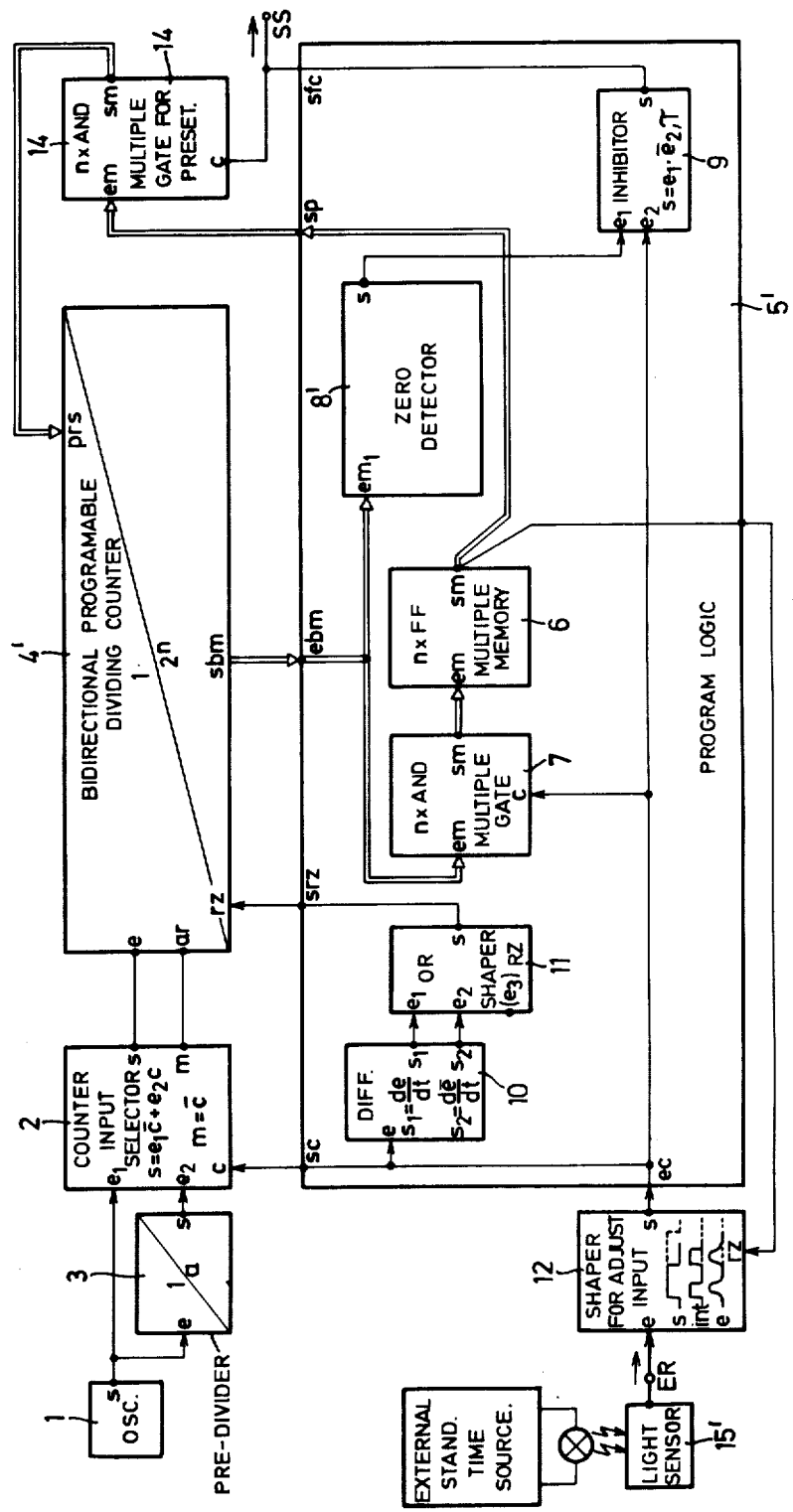
FIG. 1B is a general block diagram of another embodiment of an isochronous period generator for a watch, adapted to be readjusted and equipped with a bi-directional divider counter.

The generator may operate with any arbitrary frequency oscillator in order to provide an isochronous period set to a desired value, the only condition being that the period corresponding to the frequency of oscillator 1 be appreciably shorter than the isochronous period desired at the SS output. This is because the period of the base oscillator 1 determines the maximum deviation which is to be tolerated for the isochronous period, even when the generator has just been readjusted.

The operation of this generator will be explained, assuming that an isochronous period of the order of a second or a fraction of a second with an adjustment accuracy of at least $10^{-6}$ is desired at output SS, so that a frequency of the order of 10 MHz will be assumed for oscillator 1. It will be further assumed that oscillator 1 is of a known type and includes an output signal shaping stage, hence providing a pulse train of square pulses. That is, the output signal will jump successively and alternately from a logic level 0 to a logic level 1, and vice versa, at output $s$ of oscillator 1. Assuming the generator has already been adjusted, operation under the autonomous mode will be presently examined, this being the most common mode, with no standard time period data applied to input ER.

The input selector 2 transmits either the signal received at its input $e_1$ directly from the oscillator 1, or the signal received at its input $e_2$ from the oscillator 1 by the intermediary of predivider 3. A logic signal applied to input $c$ of selector 2 determines the choice between the two inputs $e_1$ and $e_2$. As there is no input signal (i.e. standard time period data for readjustment) at input ER, the logic level at input $c$ of selector 2 is 0 (the particulars of the shaper 12 ensuring this condition will be described further below). Therefore, as indicated by the logic equation in the block showing the selector 2, input $e_1$ will be selected and the signal directly transmitted via this input from the oscillator 1 will be emitted from output $s$ of this selector 2, and from there will pass to input $e$ of the programmable dividing counter 4.

The dividing counter 4 shown in FIG. 1A is undirectional. It is of a conventional type comprising $n$ stages of binary dividers allowing counting up to $2^n$ (hence a division for a maximum ratio of $\frac{1}{2}^n$). The output signal of the dividing counter 4, therefore, is in the form of a plurality of binary information elements (bits), each of which will appear on a particular conductor or upon a particular pair of conductors (complementary signals). This set of output data is symbolically localized in FIG. 1A by the multiple binary output sbm. It will be observed from FIG. 1A that transmissions of a single binary information element are denoted by single lines whereas parallel transmissions of a plurality of binary information elements (in this instance $n$ binary information elements) are denoted by double lines.

The data leaving the sbm output of the dividing counter 4 is applied to multiple binary input ebm of the program logic 5 within which the data is applied on one hand to input $em_1$ of the multiple coincidence detector 8 and on the other hand to input $em$ of the multiple gate 7 which comprises, in parallel, $n$ AND gates controlled by input c of the multiple gate circuit 7. In the autonomous mode (that is, input ER receives no information concerning standard time periods) multiple gate 7 is blocking, but it will be assumed that it was previously conducting to transmit a set of n binary information elements to multiple memory 6 where they still are stored. From its multiple output sm, this multiple memory 6 transmits binary multiple data (corresponding to the states of its memory flip-flops) to input $em_2$ of the multiple coincidence detector 8. The latter, which comprises n "exclusive OR" circuits, with their outputs collected on an inverted OR circuit having n inputs (or another circuit filling the same overall logic function), detects the moment when the dividing counter 4 passes to a state precisely corresponding to that stored in multiple memory 6. At that instant, coincidence detector 8 will send a signal from its output s to the input $e_1$ of inhibitor 9, the output s of which in turn activates the input $e_3$ of the zero-reset-former or shaper 11 which comprises an OR gate. The output of this shaper 11 then will be a logic level 1 which issues from the program logic 5 at its output srz to be applied to the zero reset input rz of dividing counter 4. The latter, therefore, is reset to zero having effected a counting cycle of a number of bits determined by the multiple binary information stored in memory 6.

Dividing counter 4 continually starts the same cycle and, at the termination of the cycle, a pulse from the inhibitor 9 output will be emitted by the end-of-cycle output sfc of the program logic and will appear at the SS output of the generator. In order to avoid perturbations when there is resetting to zero on account of some stages of the dividing counter possibly returning to zero faster than others, and thus causing the signal at the output of coincidence detector 8 to disappear before all the stages are back to zero, inhibitor 9 will be very slightly time-delayed to an extent compatible with the period of oscillator 1. For a frequency of about 10 MHz, such a period is approximately 100 ns. As is the case for all the program logic 5 elements, the dividing counter 4 consists of integrated circuit components of the complementary MOS type, trigger times being kept to the order of a dozen ns., and the time-delay of the inhibitor 9 being about twice this trigger time.

As long as the generator will operate in the autonomous mode in this manner, the SS output will provide periodic pulses recurring at the end of each counting cycle of dividing counter 4. As long as the frequency of the oscillator 1 will remain perfectly stable, the periods of the signals at output SS also will remain perfectly stable. If, for whatever reason, the frequency of oscillator 1 changes, or if the generator is to be set for the first time upon assembly, use is made of a standard time period, generated by an external time source and magnetically transmitted to coil 15, which period will be thus applied at the input ER of the generator. By means of pulse shaper 12 for the input signal at ER, a pulse of precise calibration and typically lasting one or two seconds arrives at input ec of the program logic 5. The particular design of shaper 12 ensuring this pulse will be described further below. This data at input ec (logic level 1) will be transmitted within logic 5 to input c of the multiple gate 7 and to input $e_2$ of inhibitor 9, and, outside the logic 5, and via its output sc, to input c of the input selector 2. This results in the following: first, the multiple gate 7 will be rendered conducting; second, transmission of an output pulse of inhibitor 9 will be blocked; and third, no longer will the input signal $e_1$ of input selector 2 appear as an output signal at s, but rather it will be the input signal from $e_2$ of selector 2 which will appear at the output of selector 2, that is, it will be the oscillator frequency after it has passed through pre-divider 3.

It will be seen below what the exact role of the pre-divider is, and presently it will be assumed that it provides at its output s a frequency equal to one-tenth of the frequency of oscillator 1 applied to its input e. Hence, counting divider 4 will count at a rate which is ten times slower. Generally, if the division ratio of the pre-divider 3 is 1/a, the oscillator frequency being f, a frequency of f/a will be applied at the input e of the dividing counter 4. Further, multiple gate 7 presently being conducting, the binary memory stages of the multiple memory 6 will constantly follow the information provided at output sbm of dividing counter 4. The multiple coincidence detector 8, therefore, will permanently provide an output signal, indicating there is coincidence, but this is without significance because of the inhibition taking place in inhibitor 9.

It will be observed, furthermore, that the input signal at ec of logic 5 arrives at the differentiator 10 which provides a short pulse when logic level 1 appears at control input ec. This short pulse transmitted from output $s_1$ to input $e_1$ of zero reset former or shaper 11 causes reset to zero of the counter precisely at the moment when the standard time period begins. Thus, the counter will count at a rate one-tenth (or 1/a) of the normal rate, starting with the zero position and during the entire standard time period. At the end of the standard time period, input ec again goes back to logic level 0, multiple gate 7 becomes blocking, and multiple memory 6 remains in the state prior to the very end of the standard time period At this time also, the differentiator sends a second pulse (differentiation of the complement of ec) from its output $s_2$ to input $e_2$ of the zero reset former 11 which in turn emits a new reset-to-zero pulse to dividing counter 4. Simultaneously too, the suppression of the 1 level at the input of selector 2 reestablishes the direct path of the oscillator frequency from the output of the oscillator 1 to the input of the counter 4, and the suppression of the 1 level at input $e_2$ of inhibitor 9 allows it again to transmit the pulse appearing at the output of the multiple coincidence detector 8. From that instant, the counting cycle in the autonomous mode will be reproduced as previously described, but the binary combination recorded in memory 6 will exactly correspond to the number of bits that the counter 4 must count in order that the period at the output SS of the generator be equal to the standard time period divided by 10 (the division ratio of pre-divider 3; in the general case, the standard time period will be divided by a). If, for instance, the standard time period at input ec of the logic had been 1 sec., the synchronous period cyclically appearing at output SS of the generator would be exactly 1/10 sec., but if on the other hand the standard time period had been 2 sec. at input ec of logic 5, the synchronous period at output SS would be precisely 0.2 sec.

Shaper 12 for the input at ER serves to supply a pulse of precisely determined length to input ec of logic 5. The data from input ER arriving at this shaper 12 as shown in FIG. 1A is obtained by means of coil 15 which can, for that purpose, be temporarily brought into couple with an external source of a standard time period. In the general case, the standard time period for readjustment may be furnished to input ER, especially if the generator is used to control the operation of a watch having the size of a wristwatch, by the intermediary of a magnetic or photoelectric receiver subject to outside information and connected inside the watch to input ER, such as coil 15 is connected. As the response characteristics of this receiver could possibly differ between the beginning and end of the pulse, which may be magnetic or optical, the generation of an exact duration pulse will preferably — but not obligatorily — be performed by means of the measured time between two short successive pulses. Thus, the beginning and end of each pulse transmitted to input ec will be determined by the appearance (or possibly the disappearance) of these two short pulses, so that the response conditions will be exactly the same at the beginning and end of the pulse of known length. In this case, the input shaper 12 must obtain from input ER two successive pulses or even number of successive pulses.

The diagram showing the block of shaper 12 in FIG. 1A shows how the pulse of predetermined length is obtained. Generally, the external standard time period circuit sending the short pulses to the receiver, that is in this case to coil 15, will be properly made in order always to transmit two pulses or a number of pairs of pulses. If somehow these short pulses were uneven in number, or if they succeeded one another with a time interval higher than the capacity of the dividing counter 4 and of memory 6, taking into account the pulse rate applied to the input of counter 4, the level of the input data at point ec still would be at 1 when the dividing counter and the memory arrive at their last position. It is clear that under these conditions, readjustment of the isochronous period at output SS will be impossible; however, in order to bring the data at input ec back to the 0 level, when the memory 6 following counter 4 arrives at its last position, memory 6 will apply to output sd of the program logic 5 and therefrom to input rz of shaper 12 data causing reset-to-zero of the output of the shaper 12. To do so, use is made of the rising edge of the inverted output of the last flip-flop of the memory 6. It will be seen below in connection with FIG. 4 how this process is effected.

In the left hand side of FIG. 1A there is shown an interesting but not absolutely necessary arrangement for improving the capabilities of the generator. If desired, one may provide the external device supplying the pulses to the input ER with an arrangement such that these pulses appear together with coded information which does not disturb the main input pulses (duration of standard period of time) and which determines a special one among different values of the isochronous period which could have to be adjusted on the basis of the duration of the applied standard period. One might, for instance, require an isochronous period 1/5, of 1/6 or 1/10 of a second which is to be supplied by the generator if the latter is used to control the oscillations of a sprung balance in a wristwatch. To that end a discriminator 13 may be used to transmit logic data to one or possibly several of three outputs $s_1$, $s_2$, $s_3$ as a function of this coded information to set the pre-divider 3 in such manner that it will effect a division, for instance, of 5, 6 or 10. corresponding to the case previously discussed. Thus, depending on the coding being distinguished, the isochronous period at the SS output will be 1/5, 1/6 or 1/10 of a second with any other value also being feasible if required.

FIG. 1B shows another embodiment of the generator. This other embodiment comprises partly the same elements as the former embodiment according to FIG. 1A and these elements are, in that case, indicated by the same reference numerals. On the other hand this other embodiment comprises, as a difference with respect to the FIG. 1A embodiment, programmable dividing counter 4', which is bi-directional and which will count either forward or backward, depending on the logic level being applied to a counting direction control input ar. Furthermore, in this embodiment according to FIG. 1B, the program logic 5' does not comprise a coincidence detector 8 which receives both the binary multiple data from the counter 4' and the multiple binary data from memory 6, but it comprises a zero detector 8' which receives only the multiple binary data from counter 4'. Thus, zero detector 8' does not operate as a coincidence detector but as a null detector, that is, it senses the counter's arrival at the zero position. In this embodiment the multiple binary data supplied by memory 6 (which is the same as in the first described embodiment), is applied to a multiple gate 14 which controls the preset of counter 4' and which transmits or blocks this data as a function of the output level of inhibitor 9. In this second embodiment according to FIG. 1B output s of the inhibitor 9 which provides the output SS of the generator is not connected as an input to the zero reset shaper 11, but it is connected to a control input c of multiple gate 14.

When the output information from memory 6 is transmitted from input em to output sm of this multiple gate 14, it will be applied to a multiple preselection input prs of counter 4'. The direction of operation of the latter is such that under the readjustment mode, it will count forward as in the embodiment previously discussed while under the autonomous mode it will count backward. At the moment when zero detector 8' has detected the zero position of the counter 4', it will send a pulse to inhibitor 9 which will render gate 14 conducting, causing the multiple binary data contained in memory 6 to be fed to counter 4' and presetting all the stages of the latter to a position corresponding to the combination stored in memory 6. Then, dividing counter 4' counts backwards the number of desired bits until it reaches zero, at which time, as previously mentioned, it will be set anew to the preselected position corresponding to the data at input prs.

In order to cause counter 4' to count backwards, input selector 2 applies to the direction coupling input ar of counter 4' a signal from output m of the selector 2, which signal is the complement of the signal applied to the input c of selector 2. Thus, in the readjustment mode, the counter's input ar is at the logic level 0 and the counter counts forward, whereas in the autonomous mode, this ar input is at the logic level 1 and the counter counts backward. This other embodiment shown in FIG. 1B provides a readjustable cycle with the same accuracy as the first embodiment shown in FIG. 1A, the second embodiment, however, providing the advantage of not requiring a multiple coincidence circuit 8 which is fairly difficult to achieve.

It will be further noted that resetting the counter 4' to zero at the end of the readjustment cycle by means of the connection between the output $S_2$ of the differentiator 10 and the input $e_2$ of the zero reset shaper 11 is not absolutely required. Indeed, as to the second embodiment, at the end of the readjustment cycle the counter 4' already is in the desired position for starting the first cycle in the autonomous mode. If counter 4' were reset to zero, this act will immediately cause zero detector 8' to operate, whereupon, after the pulse is supplied by the latter, there will be a new setting of the counter 4' to the state corresponding to the multiple information stored in memory 6. In this instance one might therefore omit resetting to zero counter 4'.

Further, as regards the first embodiment of FIG. 1A, the multiple memory 6 and the dividing counter 4 ought to be in exactly the same position at the end of the readjustment mode, so that the multiple coincidence detector 8 also ought to operate and, by itself, cause the counter 4 to reset to zero as soon as the inhibitor 9 is liberated by the disappearance of a logic level 1 at its input $e_2$. Therefore, the connection between output $S_2$ of differentiator 10 and input $e_2$ of zero reset shaper 11 may be eliminated, thus simplifying both circuits, but there would be present the very slight risk of the memory 6 being incapable of following the last step of the counter in the case of exact coincidence of the end of the input pulse at ec with a trigger of counter 4 from a pulse at the latter's input, so that there would be failure to detect coincidence. In such a case the counter would carry out a first and longer cycle in order to return to zero following its last possible position. Starting with the second cycle, however, the duration of the isochronous period again would be proper. There would merely be a shift as regards being "on time", but there would be no deviation with respect to the magnitude of the isochronous period.

As shown in FIG. 1B, an appropriate external standard time source can transmit optically a standard period of time to a light sensor 15'. This light sensor 15' is then able to supply a readjustment pulse to input ER for achieving the readjustment of the isochronous period when this is desired. It will be seen that the accuracy of readjustment of the isochronous period by nature will be equal to the period of the oscillator 1. That is if, for instance, the frequency of this oscillator is 10 megacycles and an isochronous period of one second is desired, the readjusting accuracy would be $10^{-7}$; but it would only be $10^{-6}$ if the pre-divider were to operate at a ratio of 1/10 and an isochronous period of 1/10 of a second were established. The fact that in the readjustment mode the counter input will receive pulses at a lower rate on account of the action of pre-divider 3, whereby the maximum possible error of the readjusting period is being increased, does not affect the actual error of the cycle under the autonomous mode, because then the isochronous period will be reduced in the same ratio to the period being used as the standard during the readjustment mode. The relative accuracy in effect is less, but the absolute accuracy remains unchanged because there will be a relative accuracy $a$ times larger for a period of $a$ times smaller.

FIG. 2 shows the major part of the embodiment of FIG. 1A in greater detail. Only the oscillator 1, the pre-divider 3 and the shaper 12 for the readjustment input to ER are omitted. FIG. 2 makes use of known logic notation showing clearly how the different components are made; therefore, the discussion will be restricted to differences or particularities with respect to FIG. 1A. Thus, multiple gate 7 and multiple memory 6 form a single functional block in the embodiment of FIG. 2, the multiple memory making use of flip-flops comprising a direct selection input D which is controlled, that is, made to act or not, by an input V of the flip-flop. Gate 7, therefore, is limited to a multiple connection of the inputs V of all the flip-flops of the memory 6, the multiple data from the dividing counter 4 entering the flip-flops at their input D. It was assumed these flip-flops might be set in position by acting on their single input D; however, the dotted line shows the possibility of feeding the information in the form of two complementary levels, one applied to input D and the other to a possible input $\overline{D}$. The multiple coincidence detector 8 also is obtained in a special manner, the "exclusive OR" circuits indicating coincidence by a zero level having been replaced by a set of three NAND gates which in fact form an "inverted exclusive OR" circuit. Therefore, the gate gathering the data of the individual coincidence tests is not an inverted OR (NOR) but a direct AND gate.

Similarly, the differentiating components of circuit 10 are shown as RC-sets, but it is obvious that other logic means such as is comprised in the technique of complementary MOS integrated circuits might be advantageously used as differentiation components. It will also be noted that in FIG. 2 the dot-dash line shows the boundary between that part constituting the program logic 5 and the other shown components of the generator.

Figure 3:
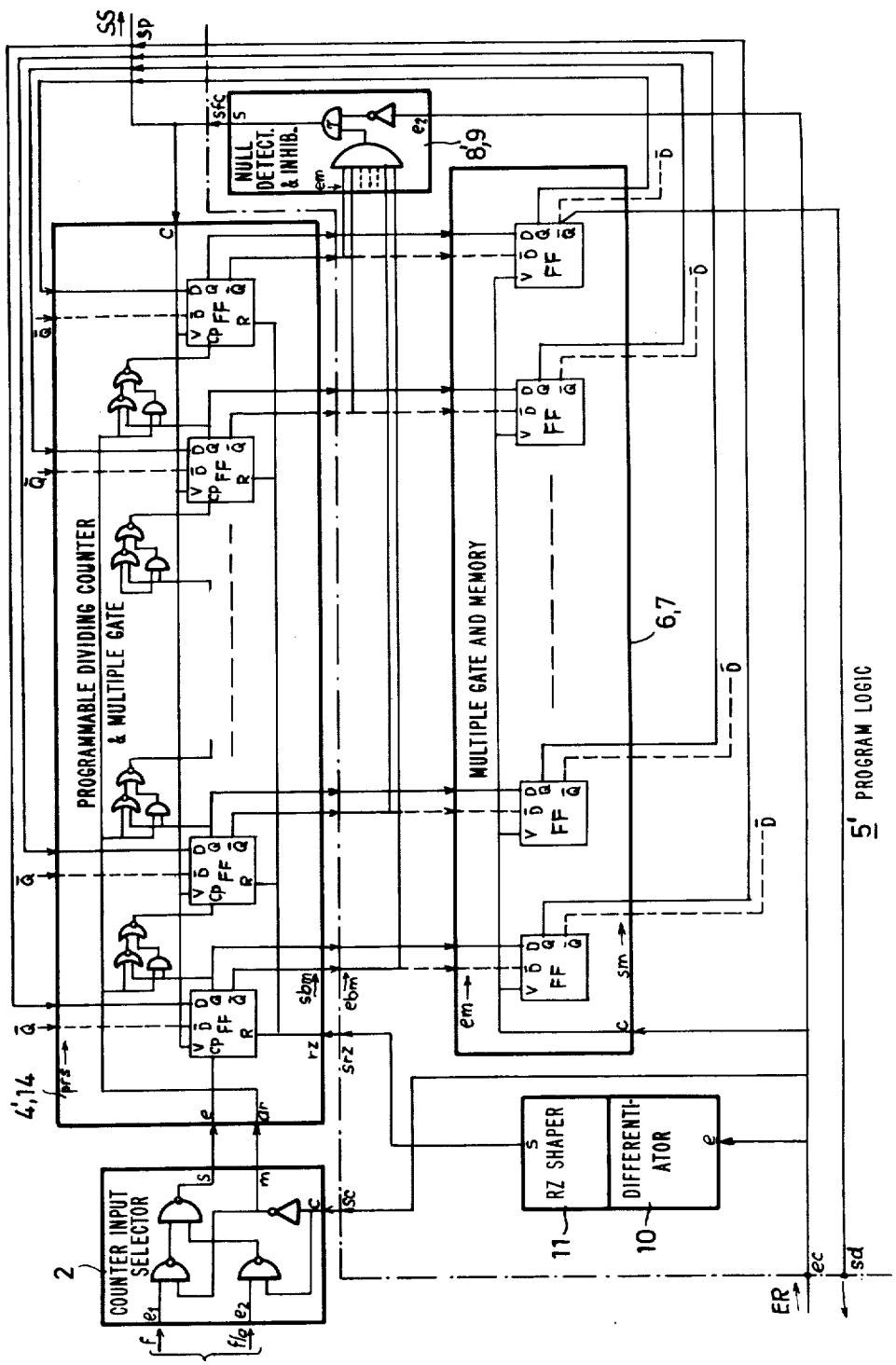
FIG. 3 is a more detailed diagram of a portion of the circuit in accordance with the embodiment of FIG. 1B.

FIG. 3 shows in more detailed manner and similarly to FIG. 2 the second embodiment shown schematically in block form in FIG. 1B. The general considerations relating to FIG. 2 and stated above also apply to FIG. 3. The multiple gate 7 and memory 6 again are compacted into a single functional block, and the same applies for the zero-detector 8' and inhibitor 9. These latter, however, are made compact merely for the sake of clarity in the drawing. Zero-detector 8' consists of a simple AND gate with $n$ inputs, each of which is connected to the output $\overline{Q}$ of the flip-flops of the dividing counter 4'.

In the embodiment of FIG. 3, multiple gate 14, which either transmits or blocks the multiple data from the memory 6 to the multiple input prs of the counter 4', is directly combined with the latter by the provision of flip-flops with direct selection inputs D controlled by an input gate V in the counter. The previously discussed considerations concerning the setting of the flip-flops of the memory 6 in the first embodiment equally apply to this embodiment to both flip-flops for the memory 6 and counter 4'.

FIG. 3 further shows that all the flip-flops of counter 4' except the first are provided with an arrangement at their inputs for inverting the direction of the counting operation. It is known that to invert the direction of operation in a binary counter, it suffices to provide all the pulse inputs $C_p$ of all the flip-flops past the first one with a signal constituting the logic complement of the one applied to make the counter operate forward. In order to do so, there may be applied to each flip-flop the output $\overline{Q}$ of the previous one rather than its output Q, but the sets of gates required for this interconnection are more complex (or require more input connections) than the set of gates shown in FIG. 3 and serving the same purpose. When there is a level 0 at input ar of the counter, the output signal $\overline{Q}$ of a flip-flop is transmitted with its original phase, after double inversion, to the input $C_p$ of the following flip-flop, whereas in the presence of a logic level 1 at the counter input ar, this signal is transmitted to the ensuing flip-flop with a phase inversion. Therefore, the programmable dividing counter operates forward when the logic level 0 is present at input ar and backward when the logic level 1 is present at that input.

The dot-dashed line in FIG. 3 shows the location of the components indicated, these being either within program logic 5' or outside of it.

Figure 4:
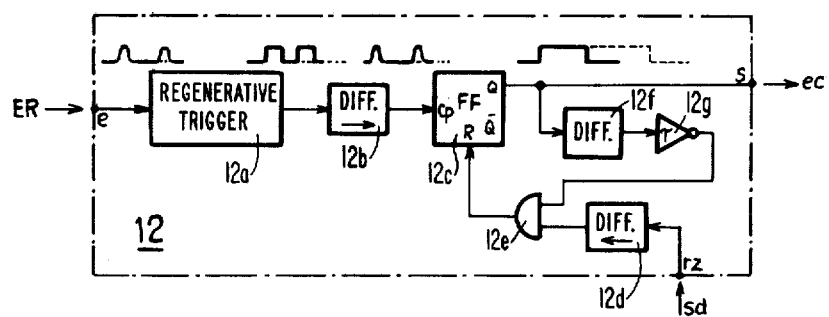
FIG. 4 is a more detailed diagram of a shaping circuit for the readjusting input, visible in FIGS. 1A and 1B.

FIG. 4 shows in greater detail the diagram of the shaper 12 for the readjustment signal at input ER, this embodiment of FIG. 4 obviously being only one of the many possibilities for achieving this stage. It is seen that the signal from input ER (supplied for instance by a magnetic, capacitive or optical receiver activated by an external standard time source as indicated above) first enters a regenerative trigger 12a such as a Schmitt trigger so that the pulses are square with well defined logic levels. Then the pulses are differentiated by differentiator 12b to avoid the value of the data being processed from remaining permanently at the logic level 1, as might be the case with an accidentally, permanently illuminated photoelectric receiver. These differentiated pulses then are applied to a flip-flop 12c of which the output provides with great accuracy the standard time period applied to the input ec of the program logic 5 or 5'. In case there is no second input pulse, which means this flip-flop 12c would stay in state 1, the data from output $\bar{Q}$ of the last flip-flop of memory 6 will be applied to an input rz of shaper 12. In case of normal readjustment, when the memory 6 need never effect a complete cycle following the counter 4, this flip-flop will only pass from state 1 to state 0 when the counter is reset to zero at the beginning of the readjustment mode, or at the end of this mode when the output of the shaper 12 for readjustment already is back at the logic level 0.

In case the flip-flop in that stage remains in the logic state 1 a relatively long period because of lack of an input pulse, the trigger edge of this last memory flip-flop, which is transmitted by a differentiator 12d in shaper 12, will reset to zero the flip-flop 12c of shaper 12 by acting on its reset-to-zero input R. In order to avoid the drop in the last memory flip-flop at the very beginning of the readjustment mode from resetting the flip-flop 12c of shaper 12 to zero, the above mentioned differentiated pulse is transmitted through an AND gate 12e which, by means of a differentiating circuit 12f and a slightly delayed inverter 12g, will be blocking at the very beginning of the resetting cycle. Thus, even if an odd number of pulses were to arrive at input ER, the readjustment mode will not be permanently locked in. Rather, the autonomous mode will be re-established, though with a non-adjusted output isochronous period that corresponds to the period of oscillator 1 multiplied by $2^n$, where n is the number of binary stages of the counter. This latitude allows, when so desired, the application of only one pulse to input ER and the determination in this manner of the effective frequency of oscillator 1, which is not known with precision, since it is without importance for the operation of the generator.

It will be noted that the present generator may be designed in many ways, the described and shown embodiments only being illustrations. This circuit would well apply to a wristwatch for economical manufacture, the setting of which would be very simply effected by means of a coil, e.g. coil 15, connected to input ER and subject to an external magnetic pulse generator, so that there would be no need to open the watch. It will be observed that the isochronous period supplied by output SS may be advantageously used to control or synchronize the oscillations of a tuning-fork or sprung-balance regulator or for activating a stepping motor driving time-indicating organs, this isochronous period also being applicable to another part of the electronic circuitry, preferably in integrated circuit form, and providing indications relating to seconds, minutes, hours, even days or dates.

Lastly, it should be noted that the time intervals, or isochronous periods, supplied by the SS output are given by very short pulses, a state of affairs which in some cases may entail drawbacks. In the case of a generator made to supply a well-defined isochronous period, as for a watch, a univibrator may be connected to this SS output, the univibrator being of a period about half that of the isochronous one. There may also be connected, independently of the value of this isochronous period, a flip-flop to output SS, the flip-flop being in state 1 during one isochronous period of SS, then in state 0 during another isochronous period at SS, thereby ultimately providing a complete isochronous period of double duration.

What is claimed is:

1. An electronic watch, in which a resettable isochronal period is repeated, including a time base means for supplying, for the measurement of time, a periodic signal, said time base means including a high frequency source provided with a quartz oscillator operating at its natural frequency, the period of oscillation of said oscillator defining the maximum deviation which is to be tolerated for the isochronal period when the isochronal period has been readjusted, and a frequency divider counter having an input which receives the high frequency of said source, said counter having an operating cycle constituting the isochronal period and restrictable to a memorized number "n" of counting steps less than the natural counting capacity of said counter; means, in the watch, for picking-up standard time information of a predetermined period from outside the watch and generating a signal corresponding to the predetermined period; conditioning means, connected to said picking-up means, for readjusting the isochronal period including means for receiving and recognizing the signal from the picking-up means to control transfer of the watch from working in an autonomous mode in which the isochronal period is produced to a readjustment mode in which the isochronal period is readjusted, said time base means further including a programmable memory means, connected to said counter and said conditioning means for memorizing the number "n", which memorized number acts on said counter during the autonomous mode to cause said counter to be reset, said conditioning means and said time base means including said programmable memory means causing, in the readjustment mode, a redetermination of the number "n" as a function of the standard time period picked-up, wherein the redetermination is constituted by said conditioning means causing zero resetting of said counter at the start of the standard time period, said high frequency source supplying the high frequency to said input of said counter without the number "n" acting on said counter, thereby enabling said counter to count freely within the field of its natural capacity, and said programmable memory means memorizing the state of counting of said counter at the end of the standard time period as a new readjusted, value of the number "n", wherein the improvement comprises:

a single detector means have a logic circuit, which merges said receiving and recognition means and said picking-up means, for receiving from the outside of the watch, through the detection of a physical action without physical contact between the physical action and the watch, a simple signal defining both the signal received and recognized by said means for receiving and recognizing to control the transfer of the watch from the autonomous mode to the readjustment mode by a given logic state which said logic circuit assumes and the standard time period by the interval of time for which this logic state lasts, said single detector means establishing the readjustment mode for the duration of the standard time period, which the interval of time for which the logic state lasts measures exactly, and wherein said detecting means establishes the autonomous mode for the entire time the standard time period is not being picked-up.

2. An electronic watch according to claim 1, wherein said divider counter counts and divides binarily, the memorized number "$n$" being memorized in a binary representation.

3. An electronic watch according to claim 2 wherein said time base means further comprises a multiple coincidence detector means, connected to said programmable memory means and said divider counter, for detecting coincidence between the count in said counter and the number "$n$" memorized and in said memory means, and means, connected to said coincidence detector means, for restricting the operating cycle of said counter to the number "$n$" including means for resetting to zero said counter when coincidence is detected.

4. An electronic watch according to claim 2 wherein said counter comprises a bidirectional counter which, in the readjustment mode, counts in the forward direction and, in the autonomous mode, counts in the reverse direction, and further including means for preselectively setting said bidirectional counter to a count corresponding to the number "$n$" when said counter, operating in the autonmous mode, reaches a count of zero, thereby restricting the steps of the operating cycle of said counter to the number "$n$".

5. An electronic watch according to claim 1, further comprising a preset input frequency divider, connected to said high frequency source, to divide the frequency of said high frequency source and supply a sub-multiple thereof to said counter, said divider counter, as a function of the condition determined by said conditioning means, receiving either, in the autonomous mode, the frequency of said source or, in the readjustment mode, the sub-multiple thereof, whereby the isochronal period is adjusted, with an approximation equal to one period of the high frequency, to a value equal to the standard time period divided by the division ratio of said preset input frequency divider.

6. An electronic watch according to claim 1, wherein said signal detector means comprises a magnetic coupling means for receiving the simple signal in the form of a magnetic field.

7. An electronic watch according to claim 1, wherein said single detector means comprises a photoelectric sensor means for receiving the simple signal in optical form.

8. An electronic watch according to claim 1 wherein said divider counter, said programmable memory means and said conditioning means comprise an integrated circuit.

9. An electronic watch according to claim 3, wherein said electronic watch is a wristwatch.

10. In combination with an electronic watch, an adjustable isochronous period generator for generating sequential output pulses having a predetermined isochronous period and a maximum allowable deviation, said generator having an autonomous mode in which said sequential output pulses are generated and a readjustment mode during which said isochronous period is readjusted by application of an external time signal having a standard time period corresponding to the predetermined isochronous period of said sequential output pulses, comprising:
an oscillator for producing a pulse train having a period which is of shorter duration than the period of said sequential output pulses and which does not exceed said maximum allowable deviation,
a predivider coupled to the output of said oscillator, said predivider producing an output having a frequency which is a predetermined fraction of the frequency of the output of said oscillator,
a frequency divider counter having input and output terminals,
detector means for receiving said external time signal from an external source and generating, when said generator is in said readjustment mode, a control signal having a precisely determined period,
switching means for selectively switching between the output of said oscillator and the output of said predivider in accordance with said control signal, said switching means coupling the output of said oscillator to said frequency divider counter when said generator is in said autonomous mode and coupling the output of said predivider to said frequency divider when said generator is in said readjustment mode, and
programmable logic means having memory means coupled to the output of said frequency divider counter, and coincidence means coupled to the output of said frequency divider counter and said memory means, said coincidence means generating during said autonomous mode an output pulse when the output count of said frequency divider counter corresponds to the count stored in said memory means, said memory means receiving during said readjustment mode the output of said frequency divider counter in accordance with the control signal generated by said detector means and storing the output of said frequency divider counter for the precisely determined period during which said control signal is being received, the output of said frequency divider counter being thereafter compared during said autonomous period with said stored output to provide sequential output pulses having said readjusted isochronous period.

11. The combination defined by claim 10 wherein said detector means comprises a shape circuit, said shaper circuit including a flip-flop having an input terminal for receiving said external time signal, an output terminal at which said control signal is generated and a reset terminal; and an AND gate having a first input coupled to the output of said memory means, a second input coupled to the output of said flip-flop and an output coupled to the reset terminal of said flip-flop.

12. The combination defined by claim 11 wherein said shaper further comprises a first differentiator and time-delayed inverter connected in series between the output of said flip-flop and the second input of said AND gate, and a second differentiator connected between the output of said memory means and the first input of said AND gate.

13. The combination defined by claim 10 wherein said programmable logic means further comprises a gate circuit interposed between the input of said memory means and the outputs of said detector means and said frequency divider counter, said gate circuit coupling the output of said frequency divider counter to said memory means only when said control signal is received from said detector means.

14. The combination defined by claim 10 wherein said programmable logic means further comprises an inhibitor circuit having a first input coupled to the output of said coincidence means, a second input coupled to the output of said detector means and an output for providing said sequential output pulses only during said autonomous mode, said control signal from said detector means preventing said inhibitor circuit from transmitting the output of said coincidence means during said readjustment mode.

15. The combination defined by claim 14 wherein said frequency divider counter is unidirectional and the output of said inhibitor circuit is coupled to said frequency divider counter for resetting said counter.

16. In combination with an electronic watch, an adjustable isochronous period generator for generating sequential output pulses having a predetermined isochronous period and a maximum allowable deviation, said generator having an autonomous mode in which said sequential output pulses are generated and a readjustment mode during which said isochronous period is readjusted by application of an external time signal having a standard time period corresponding to the predetermined isochronous period of said sequential output pulses, comprising:
- an oscillator for producing a pulse train having a period which is of shorter duration than the period of said sequential output pulses and which does not exceed said maximum allowable deviation,
- a predivider coupled to the output of said oscillator, said predivider producing an output having a frequency which is a predetermined fraction of the frequency of the output of said oscillator,
- a bi-directional frequency divider counter having first, second and third input terminals and an output terminal,
- detector means for receiving said external time signal from an external source and generating when said generator is in said readjustment mode a control signal having a precisely determined period,
- switching means for selectively switching between the output of said oscillator and the output of said predivider in accordance with said control signal, said switching means coupling the output of said oscillator to the first input terminal of said frequency divider counter when said generator is in said autonomous mode and coupling the output of said predivider to said frequency divider when said generator is in said readjustment mode, and switching means further energizing the second input terminal of said frequency divider counter in accordance with said control signal so that said bi-directional frequency divider counter counts in one direction in said readjustment mode and in the other direction in said autonomous mode,
- output gate means having an input, a reset terminal and an output coupled to the third input terminal of said frequency divider counter, and
- programmable logic means having memory means and zero detection means coupled to the output of said frequency divider counter, said zero detector means generating during said autonomous mode a sequential output pulse each time the output of said frequency divider counter reaches zero, said memory means receiving during said readjustment mode the output of said frequency divider counter in accordance with the control signal generated by said divider means and storing the output of said frequency divider counter for the precisely determined period during which the control signal is being received, the pulses at the output of said zero detector means being applied to said output gate causing said output gate means to transmit the output of said memory means to the third input terminal of said frequency divider counter each time one of said sequential output pulses is generated thereby permitting said frequency divider counter to the count stored in said memory means.

17. The combination defined by claim 16 wherein said detector means comprises a shaper circuit, said shaper circuit including a flip-flop having an input terminal for receiving said external time signal, an output terminal at which said control signal is generated and a reset terminal, and an AND gate having a first input coupled to the output of said memory means, a second input coupled to the output of said flip-flop and an output coupled to the reset terminal of said flip-flop.

18. The combination defined by claim 7 wherein said shaper further comprises a first differentiator and time-delayed inverter connected in series between the output of said flip-flop and the second input of said AND gate, and a second differentiator connected between the output of said memory means and the first input of said AND gate.

19. The combination defined by claim 16 wherein said programmable logic means further comprises a gate circuit interposed between the input of said memory means and the outputs of said detector means and said frequency divider counter, said gate circuit coupling the output of said frequency divider counter to said memory means only when said control signal is received from said detector means.

20. The combination defined by claim 16 wherein said programmable logic means further comprises an inhibitor circuit having a first input coupled to the output of said zero detector means, a second input coupled to the output of said detector means and an output for providing said sequential output pulses to the reset terminal of said output gate means only during said autonomous mode, said control signal from said detector means preventing said inhibitor circuit from transmitting the output of said coincidence means during said readjustment mode.

21. The combination defined by claim 16 wherein said external source for generating said external time signal is coupled to said detector means by a light sensor.

* * * * *